(12) United States Patent
Wong

(10) Patent No.: US 11,448,664 B2
(45) Date of Patent: *Sep. 20, 2022

(54) LARGE RADIUS PROBE

(71) Applicant: Bruker Nano, Inc., Santa Barbara, CA (US)

(72) Inventor: Jeffrey Wong, Simi Valley, CA (US)

(73) Assignee: Bruker Nano, Inc., Santa Barbara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/069,302

(22) Filed: Oct. 13, 2020

(65) Prior Publication Data

US 2021/0132110 A1 May 6, 2021

Related U.S. Application Data

(63) Continuation of application No. 15/935,937, filed on Mar. 26, 2018, now Pat. No. 10,802,045.

(51) Int. Cl.
| | |
|---|---|
| *G01Q 60/30* | (2010.01) |
| *G01Q 70/10* | (2010.01) |
| *G01Q 70/16* | (2010.01) |
| *G01Q 60/38* | (2010.01) |
| *C23C 16/34* | (2006.01) |
| *C23C 16/56* | (2006.01) |
| *C23C 16/44* | (2006.01) |
| *C23C 16/02* | (2006.01) |
| *G01Q 60/36* | (2010.01) |

(52) U.S. Cl.
CPC ......... *G01Q 60/38* (2013.01); *C23C 16/0227* (2013.01); *C23C 16/345* (2013.01); *C23C 16/44* (2013.01); *C23C 16/56* (2013.01); *G01Q 60/366* (2013.01); *G01Q 70/10* (2013.01)

(58) Field of Classification Search
CPC ......... G01N 60/38; G01N 70/10; G01N 70/16
See application file for complete search history.

(56) References Cited

U.S. PATENT DOCUMENTS

| | | | |
|---|---|---|---|
| 10,802,045 B2 * | 10/2020 | Wong | ............ C23C 16/56 |
| 2005/0017171 A1 | 1/2005 | Samuelson et al. | |
| 2005/0279729 A1 | 12/2005 | Okulan et al. | |
| 2008/0135749 A1 * | 6/2008 | van der Weide | ...... G01Q 60/38 |
| | | | 250/306 |
| 2010/0005553 A1 | 1/2010 | Jin et al. | |

FOREIGN PATENT DOCUMENTS

| | | |
|---|---|---|
| JP | H10170530 | 6/1998 |
| WO | 2010011186 | 1/2010 |

* cited by examiner

*Primary Examiner* — Eliza W Osenbaugh-Stewart
(74) *Attorney, Agent, or Firm* — Boyle Fredrickson S.C.

(57) ABSTRACT

A large radius probe for a surface analysis instrument such as an atomic force microscope (AFM). The probe is microfabricated to have a tip with a hemispherical distal end or apex. The radius of the apex is the range of about a micron making the probes particularly useful for nanoindentation analyses. The processes of the preferred embodiments allow such large radius probes to be batch fabricated to facilitate cost and robustness.

14 Claims, 10 Drawing Sheets

LARGE RADIUS PROBE

CROSS-REFERENCE TO RELATED APPLICATIONS

This application is a continuation of U.S. patent application Ser. No. 15/935,937, filed Mar. 26, 2018 (U.S. Pat. No. 10,802,045, issued Oct. 13, 2020), which is entitled Large Radius Probe. The subject matter of this application is hereby incorporated by reference in its entirety.

BACKGROUND OF THE INVENTION

Field of the Invention

The preferred embodiments are directed to a probe device for a metrology instrument and a corresponding method of manufacture, and more particularly, a large radius atomic force microscope (AFM) probe device that can be batch fabricated and is particularly adapted for nanoindentation measurements.

Description of Related Art

Scanning probe microscopes (SPMs), such as the atomic force microscope (AFM), are devices which use a sharp tip and low forces to characterize the surface of a sample down to atomic dimensions. Generally, the tip of the SPM probe is introduced to the sample surface to detect changes in the characteristics of the sample. By providing relative scanning movement between the tip and the sample, surface characteristic data can be acquired over a particular region of the sample and a corresponding map of the sample can be generated.

Most AFMs employ sharp tipped probes (radius less than 10 nm) for high resolution. Some applications require a probe with a larger tip radius, however. Nanoindentation using an AFM is one such application. Nanoindentation is used to conduct mechanical property tests, such as the hardness or modulus of a sample. Typically, when performing nanoindentation measurements, an AFM monitors force displacement of the tip to provide an indication of Young's modulus. AFM can also perform nano-scratching and wear testing to investigate material adhesion and durability.

An overview of AFM and its operation follows. A typical AFM system is shown schematically in FIG. 1. An AFM 10 employing a probe device 12 including a probe 14 having a cantilever 15. XYZ scanner generates relative motion between the probe 14 and sample 22 while the probe-sample interaction is measured. In this way images or other measurements of the sample can be obtained. XYZ scanner is typically comprised of one or more actuators that usually generate motion in three orthogonal directions (XYZ). Often, XYZ scanner is a single integrated unit that includes one or more actuators to move either the sample or the probe in all three axes, for example, a piezoelectric tube actuator. Alternatively, the scanner may be an assembly of multiple separate actuators. Some AFMs separate the scanner into multiple components, for example an XY scanner that moves the sample and a separate Z-actuator that moves the probe. The instrument is thus capable of creating relative motion between the probe and the sample while measuring the topography or some other surface property of the sample as described, e.g., in Hansma et al. U.S. Pat. No. RE 34,489; Elings et al. U.S. Pat. No. 5,266,801; and Elings et al. U.S. Pat. No. 5,412,980.

In a common configuration, probe 14 is often coupled to an oscillating actuator or drive 16 that is used to drive probe 14 at or near a resonant frequency of cantilever 15. Alternative arrangements measure the deflection, torsion, or other motion of cantilever 15. Probe 14 is often a microfabricated cantilever with an integrated tip 17.

Commonly, an electronic signal is applied from an AC signal source 18 under control of an SPM controller 20 to cause actuator 16 (or alternatively XYZ scanner) to drive the probe 14 to oscillate. The probe-sample interaction is typically controlled via feedback by controller 20. Notably, the actuator 16 may be coupled to the XYZ scanner and probe 14 but may be formed integrally with the cantilever 15 of probe 14 as part of a self-actuated cantilever/probe.

Often a selected probe 14 is oscillated and brought into contact with sample 22 as sample characteristics are monitored by detecting changes in one or more characteristics of the oscillation of probe 14, as described above. In this regard, a deflection detection apparatus 25 is typically employed to direct a beam towards the backside of probe 14, the beam then being reflected towards a detector 26. As the beam translates across detector 26, appropriate signals are processed at block 28 to, for example, determine RMS deflection and transmit the same to controller 20, which processes the signals to determine changes in the oscillation of probe 14. In general, controller 20 generates control signals to maintain a relative constant interaction between the tip and sample (or deflection of the lever 15), typically to maintain a setpoint characteristic of the oscillation of probe 14. More particularly, controller 20 may include a PI Gain Control block 32 and a High Voltage Amplifier 34 that condition an error signal obtained by comparing, with circuit 30, a signal corresponding to probe deflection caused by tip-sample interaction with a setpoint. For example, controller 20 is often used to maintain the oscillation amplitude at a setpoint value, AS, to insure a generally constant force between the tip and sample. Alternatively, a setpoint phase or frequency may be used.

A workstation 40 is also provided, in the controller 20 and/or in a separate controller or system of connected or stand-alone controllers, that receives the collected data from the controller and manipulates the data obtained during scanning to perform point selection, curve fitting, and distance determining operations.

The deflection of the cantilever in response to the probe tip's interaction with the sample is measured with an extremely sensitive deflection detector, most often an optical lever system. In such optical systems, a lens is employed to focus a laser beam, from a source typically placed overhead of the cantilever, onto the back side of the cantilever. The backside of the lever (the side opposite the tip) is reflective (for example, using metalization during fabrication) so that the beam may be reflected therefrom towards a photodetector. The translation of the beam across the detector during operation provides a measure of the deflection of the lever, which again is indicative of one or more sample characteristics.

In nanoindentation experiments using AFM, the tip of the probe is relatively dull, unlike probes employed in typical AFM which have sharp tips (radius less than 10 nm). A nanoindentation probe has a tip radius that is preferably about a micron. Moreover, the apex is preferably substantially spherical. Some known indentation tips are rugged, such that profiling can be performed, but with low resolution. Such tips may be used to measure step heights, but nanoscale topography is not possible.

To nanoindent very small volume samples and obtain good resolution data, researchers often employ diamond-tipped probes or coated AFM tips. In the end, nanoindentation requires probes that are sufficiently strong to withstand the pressures exerted on samples of varying hardness. The apexes of these tips are typically irregularly shaped, making it difficult to accurately correlate displacement to force, thereby introducing error to the desired material characteristic measurement.

Typically, for nanoindentation, users purchase tipless AFM probes and attach tiny spheres to the distal or free end of the cantilever. The tiny spheres may be made of a variety of materials depending on the users' application. This attachment operation is performed on a probe-by-probe basis, and therefore, is time-consuming and costly. In this regard, the spheres are most often glued to the levers which lead to a slew of potential issues. First and foremost, the integrity of the bond must be considered as the tips are caused to repeatedly impact samples of varying hardness. Also, the application of the glue itself to these small scale spheres is difficult. Care needs to be taken to make sure no glue remains on the surfaces of the probe tip that interact with the sample, as any extra material can alter the nanoindentation measurement. Moreover, because these expensive AFM tips can get contaminated during nanoindentation experiments, users often want to clean them for re-use. Typically, a solvent is used, which may not agree with the glue, and compromise the bond. Overall, the attachment process is complicated and costly, with non-ideal yield and limitations on re-use.

In another alternative, it is known to "blunt" the end of a standard AFM tip. In this case, the sharp AFM tip is dulled using high temperature reforming of the apex. This often requires re-filling at least a portion of the apex with silicon to re-shape it, a difficult process, often with uncertain results. In addition, the achievable tip radii are in the range of 150-900 nm (less than the desired 1 µm for nanoindentation). The re-filling process can be used to make the radius larger, but then it is difficult to maintain the desired spherical shape. And, like the other known options, this technique is performed on a probe-by-probe basis, and thus is also time-consuming and costly.

In yet another alternative, electronic beam deposition (EBD) (e-beam deposited carbon) and Scanning Electron Microscopy (SEM) may be used to form the spheres on probe cantilevers. Similar to the problems of the other probe solutions, this option is time-consuming and expensive, and the yield of high integrity probes is often low. SEMs are million plus dollar tools employing sophisticated equipment (e.g., alignment tools). The process is extremely slow as one probe at a time is made. In addition, most often the resulting tip radius is still sub-micron. If the probe is attempted to be made larger, the ball becomes less spherical (oblong even)—which is non-ideal for the precise material property tests contemplated by the present preferred embodiments. Cleaning of these types of tips is difficult, if not impossible.

In view of the above, the field of nanoindentation using AFM was in need of a probe that overcomes the above-noted drawbacks related to maintaining a spherical apex, as well as cost of manufacture and durability. More particularly, a probe suitable for nanoindentation and having a spherically-shaped apex, a tip radius of about 1 µm, and capable of being batch fabricated was desired.

Note that "SPM" and the acronyms for the specific types of SPM's, may be used herein to refer to either the microscope apparatus, or the associated technique, e.g., "atomic force microscopy."

SUMMARY OF THE INVENTION

The preferred embodiments overcome the drawbacks of prior solutions by providing a nanoindentation probe and corresponding method of manufacture that uses photolithographic techniques to define a post and then deposit a material capable of being conformally deposited on the post. This deposition (e.g., LPCVD) develops a hemispherical distal end at the tip of the probe. Large radius probes made according to the present techniques are batch fabricated and thus are less costly. The microfabrication process yields bulk probes with high integrity. Also, no spheres need to be attached to the AFM tip, nor do the spheres need to be machined ("blunted") from existing tips or formed using highly sophisticated tools (e.g., SEM).

According to a first aspect of the preferred embodiment, a method of batch-fabricating probes for a surface analysis instrument includes providing a substrate and forming an array of posts from the substrate. Then, the method includes depositing tip material on the posts so as to create a hemispherical cap on each post. After the tip material is removed around the cap, a cantilever for each cap is formed.

According to another aspect of the preferred embodiment, the forming step includes patterning an array of cylindrical photoresist features on the substrate, etching the substrate and then removing the photoresist features so as to reveal the array of posts.

In a further aspect of this embodiment, the posts are substantially cylindrical with or without a pointed apex. Further, a width of the posts is preferably narrowed. This may be done by isotropically etching the posts or consuming the post material by oxidation and etch.

According to a still further aspect of the preferred embodiment, the tip material is any material that can be conformally deposited. For example, the tip material may be silicon nitride.

In another aspect of the preferred embodiment, the cap defines a tip of the probe, and a radius of the tip is at least ¼ micron. Preferably, the tip radius is at least 1 micron.

In another aspect of this embodiment, parameters of the substrate etch are selected so as to form the posts with a flared base.

According to a still further aspect of the preferred embodiment, the cantilever is formed either from the tip material itself or from the silicon material underneath the cap.

In another aspect of this embodiment, the hemispherical caps form the apex of high aspect ratio tips. Further, the tips may be tilted to accommodate mounting the probe in the surface analysis instrument.

According to a further aspect of the preferred embodiment, a large radius AFM probe is microfabricated according to a process including the steps of providing a substrate and forming an array of posts from the substrate. Tip material is then deposited on the posts so as to create a hemispherical cap on each post. The tip material is removed around the cap and a cantilever is formed for each cap.

These and other objects, features, and advantages of the invention will become apparent to those skilled in the art from the following detailed description and the accompanying drawings. It should be understood, however, that the detailed description and specific examples, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

A preferred exemplary embodiment of the invention is illustrated in the accompanying drawings in which like reference numerals represent like parts throughout, and in which.

DETAILED DESCRIPTION OF THE PREFERRED EMBODIMENT

Figure 1:
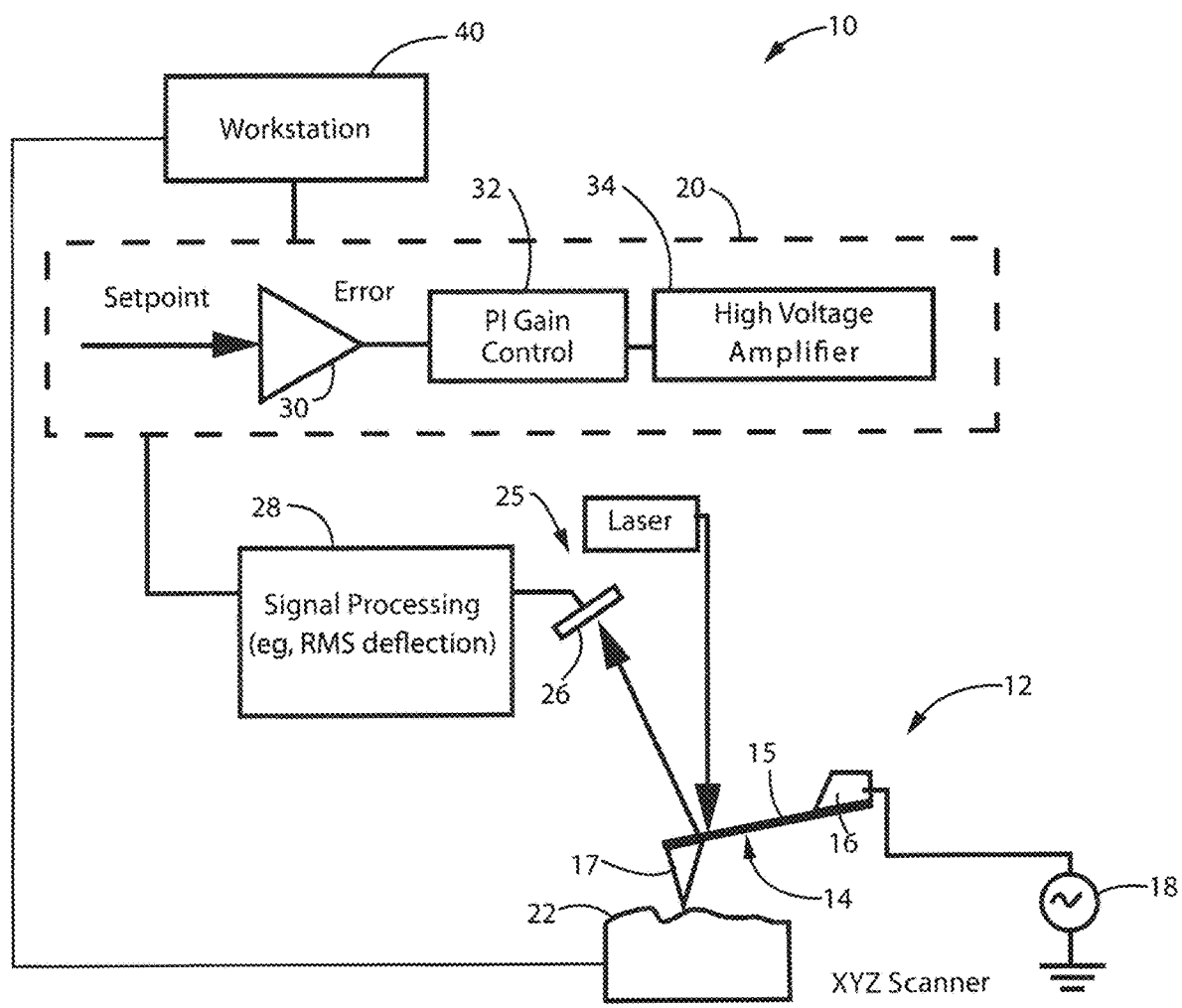
FIG. 1 is a schematic illustration of a Prior Art atomic force microscope.
Figure 2:
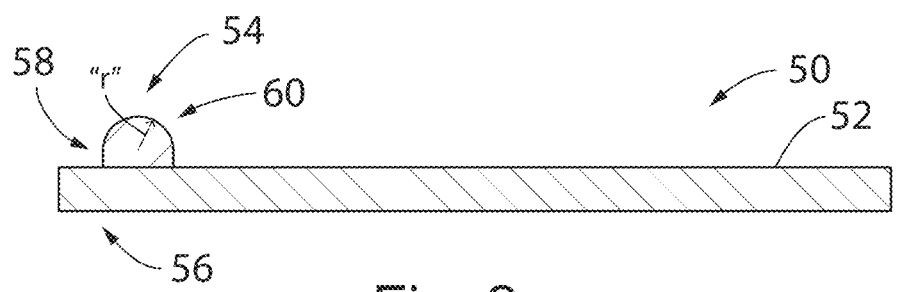
FIG. 2 is a schematic side elevational view of a probe having a low aspect ratio tip and a hemispherical apex, according to a preferred embodiment.

Referring initially to FIG. 2, probe 50 for use in an atomic force microscope and microfabricated according to the preferred embodiments is schematically shown. Probe 50 includes a cantilever 52 made of, e.g., silicon, that may be photolithographically patterned on a silicon wafer (i.e., the substrate). Probe 50 includes a tip 54 supported at a free end 56 of cantilever 52. Tip 54 has a large radius ("r"), on the order of about one (1) micron, but may have a radius as small as ¼ micron and as large as 25 microns. Tip 54 of FIG. 2 is a robust low aspect ratio tip and therefore is suitable not only for nanoindentation, but low resolution imaging.

Tip 54 has a proximal end 58 that interfaces free end 56 of cantilever 52, and a distal end 60 that extends from free end 56 and is configured to interact with a sample (not shown). Distal end 60 of tip 54 has a hemispherical-shaped apex produced according to the methods described herein. Most generally, a selected tip material (e.g., silicon nitride) is built up on a post or spike (e.g., FIG. 9) that has been formed (e.g., photolithographically) from, for example, the silicon wafer. Importantly, unlike known techniques, which produce probes one-by-one, probe 50 is batch fabricated so the portion of tip 54 (i.e., distal end 60) that interacts with the sample does not have to be attached to a standard AFM cantilever or tip (glued or otherwise), or modified from an existing AFM tip.

Figure 3:
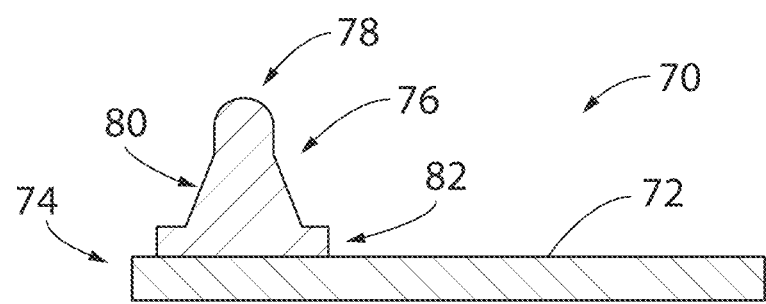
FIG. 3 is a schematic side elevational view of a probe having a tip with a hemispherical apex and a flared base, according to another preferred embodiment.

Turning to FIG. 3, a probe 70 having a cantilever 72 formed from a substrate (e.g., photolithographically patterned on a silicon wafer) includes a free end 74 supporting a large radius tip 76. Tip 76 includes a distal end 78 (i.e., apex) having a hemispherical shape and a large, micron sized radius, and a conical or pyramidal shaped base or body 80. Tip 76 also sits on a platform or base 82 made of the same material as tip 76 (for example, silicon nitride) that is deposited on the silicon wafer during formation of tip 76, as described further below. The funnel-shaped body 80 of tip 76 is formed by starting with a correspondingly shaped post or spike (described further below) and selecting certain material deposition parameters. The flared body 80 provides support for particular applications in which a high aspect ratio tip is required and the risk of shearing or otherwise breaking apex of tip 76 off probe 70 is high (harder samples, etc). Tall tips without the flared base are more flexible and may experience undesired lateral displacement in certain applications.

Figure 4:
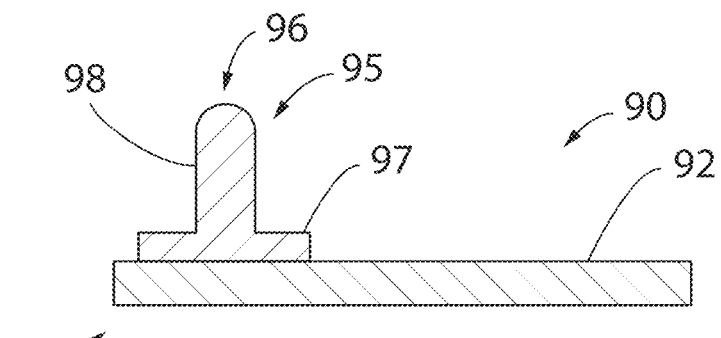
FIG. 4 is a schematic side elevational view of a probe having a high-aspect ratio tip and hemispherical apex.

FIG. 4 illustrates a probe 90 manufactured according to the disclosed methods, similar to the large radius low-aspect ratio tip of probe 50 of FIG. 2. Probe 90 includes a cantilever 92 having a free end 94 supporting a tip 95. Tip 95 has a hemispherical apex 96 and has a platform 97 formed during manufacture (e.g., using LPCVD to conformally deposit $Si_3N_4$), as described below. Unlike probe 70 and its funnel-shaped body 80, tip 95 is a high aspect ratio tip having an elongate body 98 with a substantially uniform width along its length. This style tip is preferred for example, for deep trench samples or samples with high aspect ratio walls where interference from a flared base or the cantilever itself needs to be avoided.

Figure 5A:
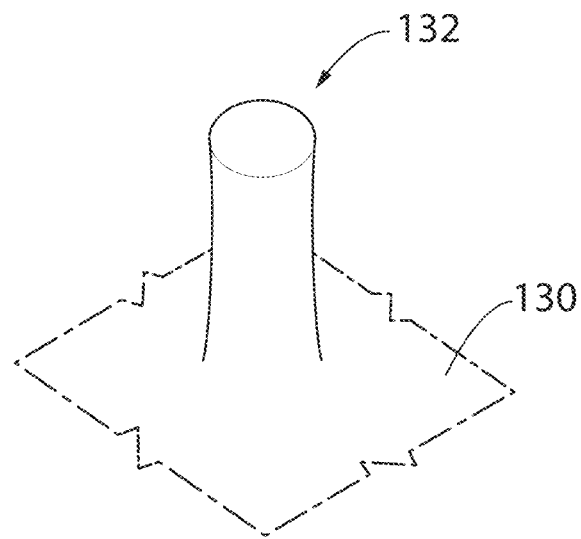
FIGS. 5A-5F are a series of images of the stepwise microfabrication of AFM probes with large radius tips, according to a method of the preferred embodiments.
Figure 5B:
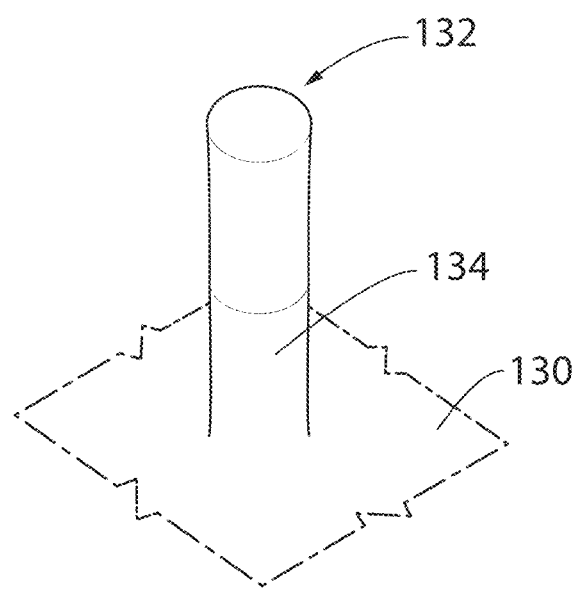
Figure 5C:
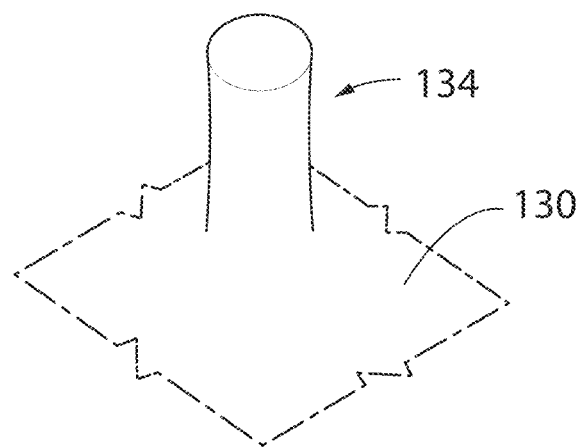

The series of schematic drawings shown in FIGS. 5A-5F illustrate a probe as it is being batch-fabricated according to one method of the preferred embodiments. The process yields an array of probes having large radius hemispherical tips. As noted previously, a post or spike is formed first and provides the structure upon which tip material will be deposited. Starting with FIG. 5A, a substrate 130 (e.g., a silicon wafer with or without a surface material such as but not limited to an oxide, nitride, metallic or composite film) is provided and a layer of photoresist (not shown) is applied thereon. Using an appropriate mask, an array of photoresist structures (e.g., cylinders) for etching the posts upon which the tips of the probes will be formed is patterned on the photoresist. After an appropriate selective chemical dissolution of the photoresist, an array of photoresist posts 132 remains with widths between ½ micron and 10 microns and heights between ¼ micron and 30 microns. Turning to FIG. 5B, the silicon wafer 130 is then etched (dry/wet) using the photoresist structures 132 as a mask. What remains is an array of silicon posts 134, with the photoresist cylinders 132 residing thereon. Once the photoresist cylinders 132 are removed, an array of silicon structures (FIG. 5C) remains. These posts 134 will provide a base structure for the fabrication of the probe tips.

Figure 5D:
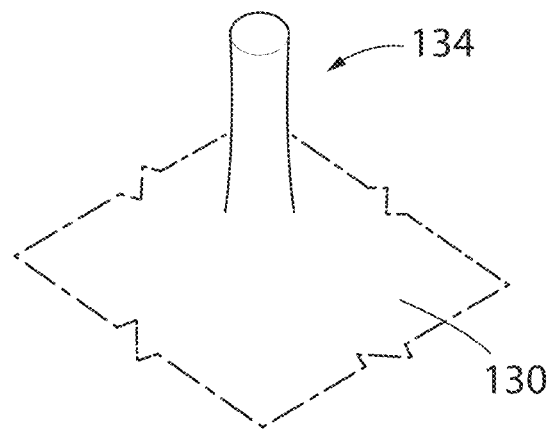

Next, in FIG. 5D, an isotropic etch may be employed to narrow the width "w" of the silicon structure 134 from about 1.5 μm to about ¼ micron, for example, essentially creating a sub-micron silicon post or spike. Although posts made of silicon are described herein, the posts may be fabricated from deposited nitride or oxide, for example. The resultant spike is generally uniform along its entire width; the width of the post is in the range of about ¼ micron.

Figure 5E:
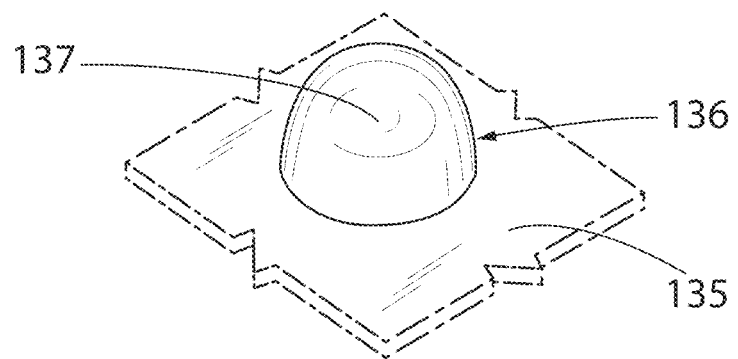

In FIG. 5E, after placing the wafer in a furnace, LPCVD of silicon nitride 135 (2.95 µm, for example) can be used to create a hemispherical cap 136 around the silicon posts or spikes 134 of the array. Notably, silicon nitride is one preferred material, but any material capable of providing a conformal coating on posts 134 may be utilized. The radius of hemispherical caps 136 can be in the range of about ¼ micron up to about 25 µm. The actual radius will be dependent on how long the film is deposited on the posts, as understood in the art.

Figure 5F:
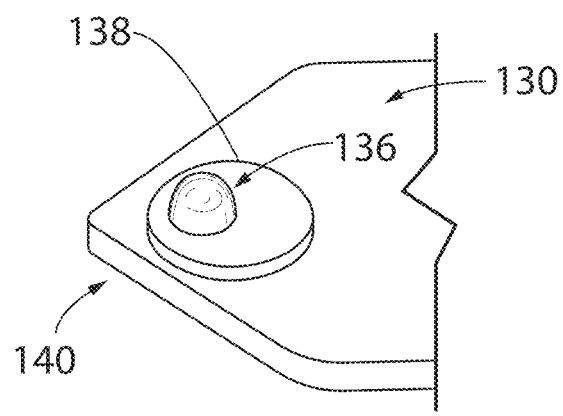

Turning next to FIG. 5F, some of the silicon nitride 135 is photolithographically removed using an appropriate mask, protecting tip with cap 136 and leaving a platform 138 of silicon nitride between the tip and substrate 130. Platform 138 is a natural artifact of the process and will influence the cantilever's frequency depending on its dimensions. In this regard, the dimensions will influence the weight of tip 136; the larger platform 138, the lower the resonant frequency. Finally, a cantilever 140 is made, preferably using photolithography as well. An appropriate mask is employed to pattern cantilevers 140, making sure to align tips 136 near the distal or free end of the levers. A plasma etch of the silicon wafer may be used to define cantilevers 140. Then, a backside etch (e.g., KOH) may be used to simultaneously release the freestanding cantilevers and define the probe bodies.

Figure 6:
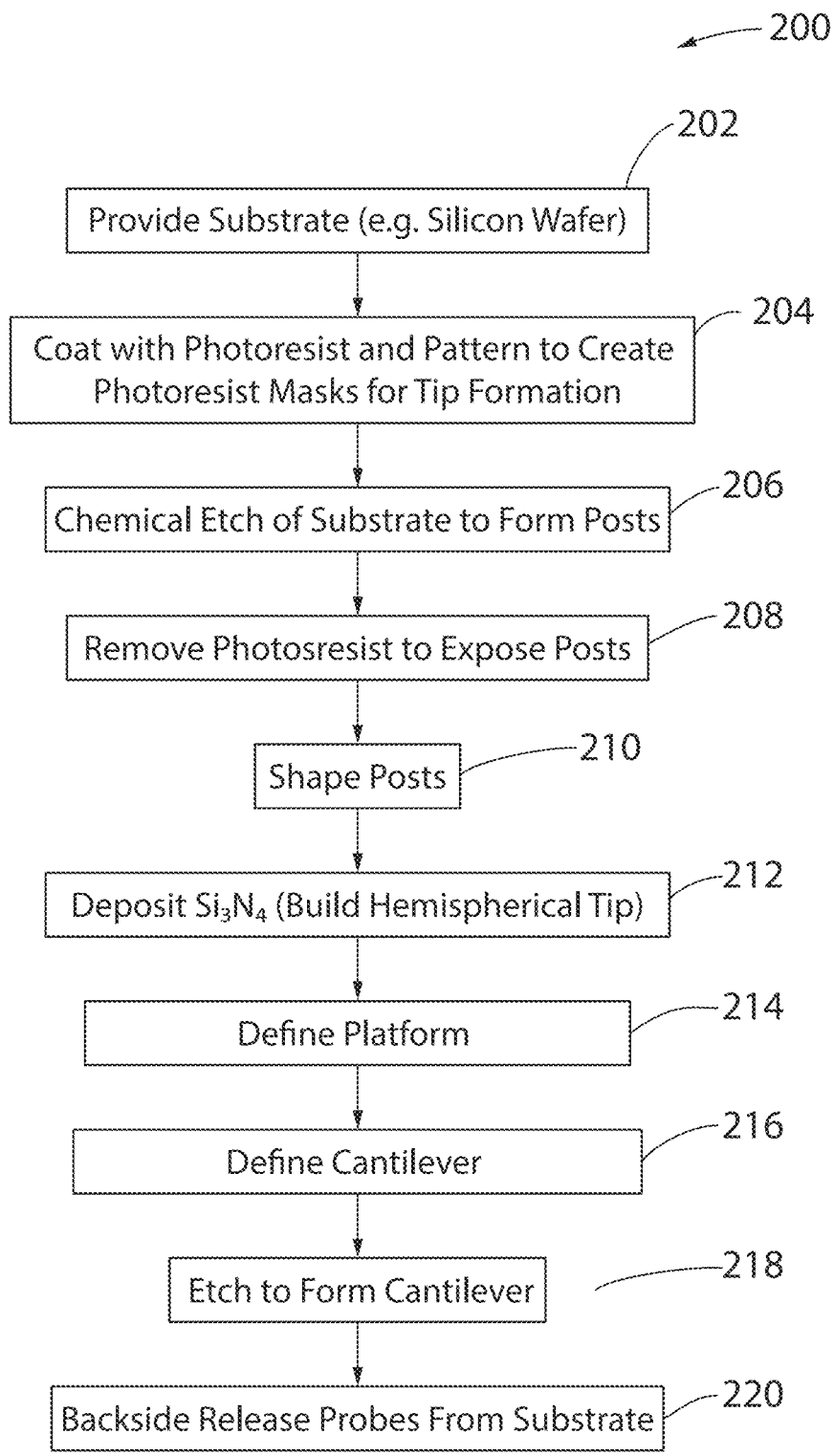
FIG. 6 is a flow chart of a method to batch fabricate large radius probes of the type shown in FIG. 2, according to a preferred embodiment.

Turning to FIG. 6, a method 200 of batch fabricating large radius probes, such as those shown in FIGS. 2-4 is shown. Method 200 will be described in conjunction with FIGS. 5A-5F to illustrate the probe build. Method 200 includes a first step, Block 202, of providing a substrate, a silicon wafer, for example (130 in FIG. 5A). The wafer is used as a substrate for coating a photoresist in Block 204. An appropriate mask is used to create photoresist structures (132 in FIG. 5A) that will be used as a mask to create silicon posts. Photoresist structures have an appropriate width that will at least partially dictate the size of the radius of the tips. Next, using lithography in Block 206, posts are fabricated using, e.g., a chemical etch (FIG. 5B). Posts provide the structure upon which the tip material is deposited to form the large radius apex of the tips. Once the posts are built, the photoresist is removed in Block 208 (post 134 in FIG. 5C). The image transfer is used to create the silicon spikes. After a lithography step to mask the wafer for production of the spike, a dry etch of the silicon is performed. This provides a deep etch into the silicon without losing uniformity in the width or diameter of the spike. In the end, high aspect ratio spikes are produced uniformly across the wafer using silicon, oxide, or a nitride.

Next, in Block 210, the resulting posts are shaped (e.g., to narrow their width) using known dry or wet etch techniques (FIG. 5D). The nitride is then deposited to begin to form the tip in Block 212. As the nitride is deposited, it coats the entire wafer including around the posts (135 in FIG. 5E). This silicon nitride begins to build around the posts and form the tip. Ultimately, a tip 136 having a cap defining a hemispherical apex 137 is produced (FIG. 5E).

In Block 214, a platform or base for the tip is formed using an appropriate mask and removing the nitride layer. Platform 138 typically is round (FIG. 5F) with a diameter that is several microns wider than the width of the tip/base structure. Variations in the diameter of the platform can be used to target the cantilever's frequency without affecting its stiffness. This is preferably done with photolithography but other known methods may be used. Next, the process includes a step (Block 216) to define the cantilever using, e.g., suitable appropriate photolithography techniques. Once the cantilever is defined, an etch is performed in Block 218 to produce the cantilever (140 in FIG. 5F). Finally, in Block 220, the probes are released from the wafer (e.g. backside etch) producing the resultant large radius probes.

Figure 7:
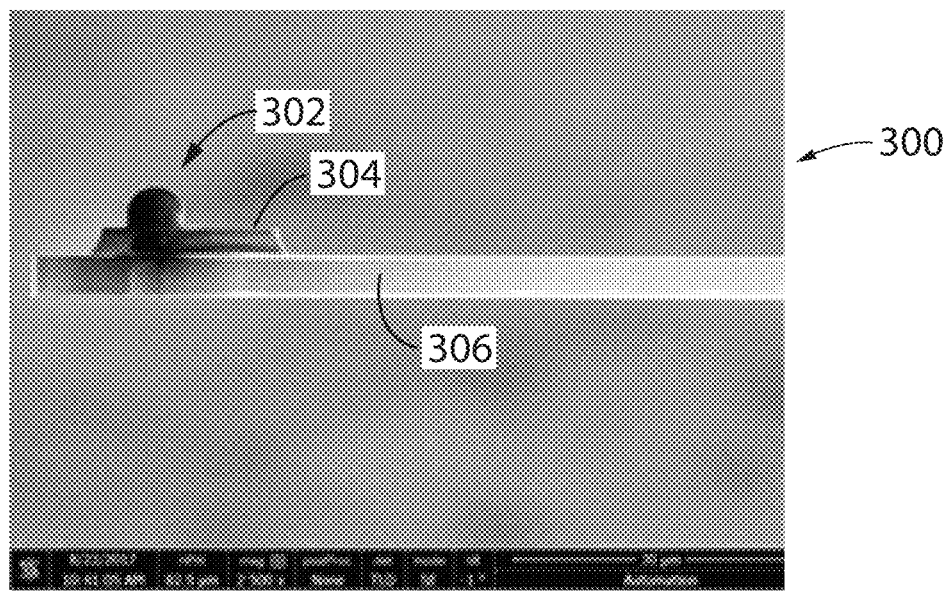
FIG. 7 is an image of a probe produced using the method of FIG. 6, with a silicon lever.
Figure 8:
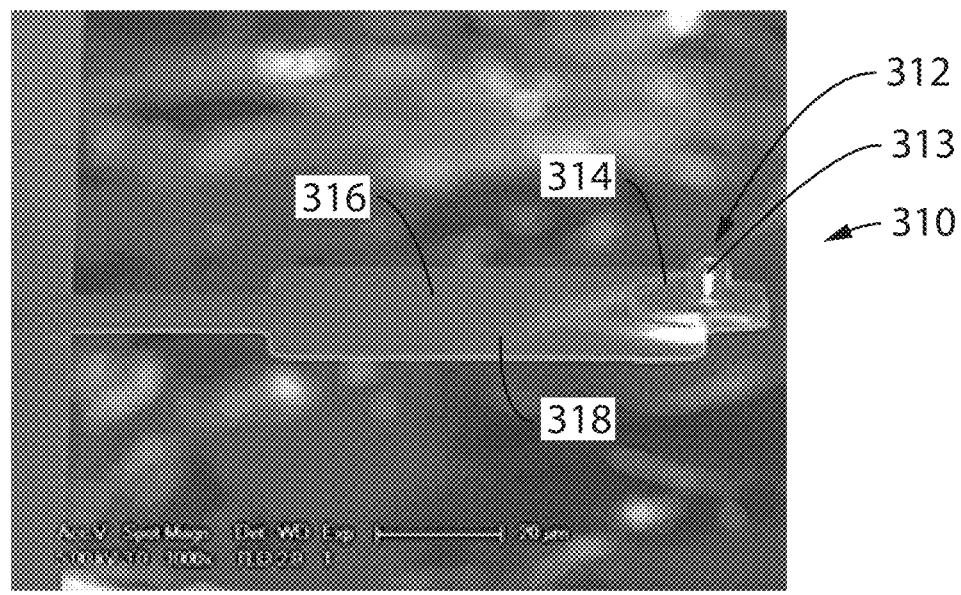
FIG. 8 is an image of a probe produced using the method of FIG. 6, with a silicon nitride lever.

Using the method of FIG. 6 described in connection with FIG. 5A-5F, indentation probes of different types can be produced. Turning to FIG. 7, an image of a nanoindentation probe 300 with a silicon nitride tip 302 and platform 304, as well as a silicon lever 306 is shown. This is a stiffer version of the probe. In FIG. 8, a nanoindentation probe 310 with a silicon nitride tip 312 and platform 314, as well as lever 316 is shown in the image. This is a lower stiffness (lower spring constant, e.g., for softer samples) probe. Each probe is made with the post developed first (post 313 can be seen in FIG. 8) and then the nitride deposited thereon. The difference between probe 300 with the silicon lever 306 (FIG. 7) and probe 310 with nitride lever 316 (FIG. 8), is the formation of the cantilever itself. In one example, silicon cantilever 306 is patterned on the silicon wafer (substrate) itself. The nitride lever 316 of FIG. 8, on the other hand, is formed from the deposited nitride material used to build the tip. Notably, the nitride lever in this case is shaped to include a midsection 318 of greater width than the proximal end of the lever attached to the base of the assembly as well as the distal end of the lever supporting the tip.

Figure 9:
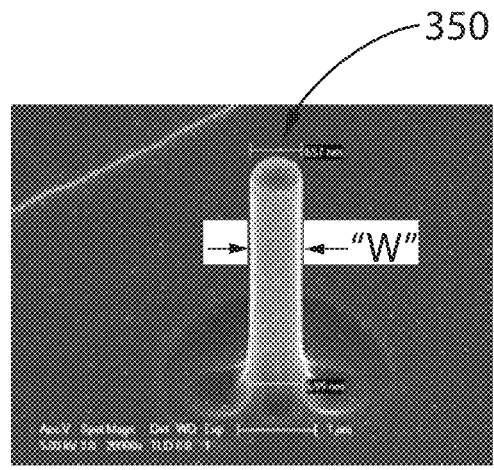
FIG. 9 is an image of a high aspect ratio post structure used to produce a probe such as that shown in FIGS. 7 and 8.

Additional images showing the process and the different types of post structures and hemispherical structures developed are illustrated in FIGS. 9-12. In FIG. 9, a post structure 350 having a substantially uniform width "w" along its entire length is shown. Such posts are typically about a ¼ micron wide, but they can be more narrow. The radius of the tip that is ultimately developed using post 350 can be sub-micron up to 25 microns. The post 350 shown in FIG. 9 provides a high aspect ratio tip which is defined by essentially having at least a 5:1 height to width ratio, and more preferably, a 10:1 height to width ratio. A non-high aspect ratio tip is typically about 1:1. Ultimately, a high aspect ratio tip is produced using a post (FIG. 9) with a controlled diameter across the entire wafer so that the probes can be batch fabricated.

Figure 10:
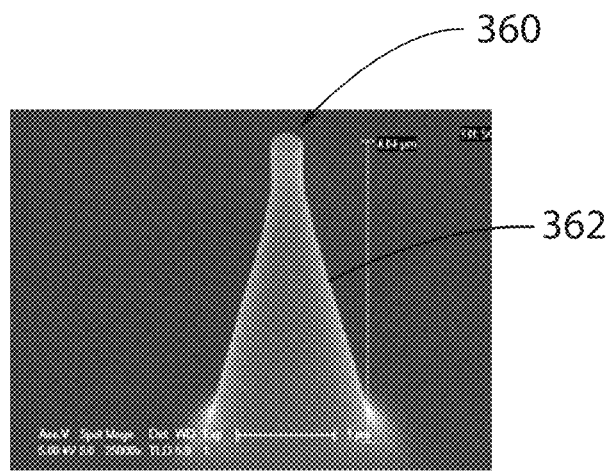
FIG. 10 is an image of a post structure similar to FIG. 9, but with a flared base.

For additional strength, a post structure 360 with a bottom flare 362 may be developed (see also, schematic probe 70 of FIG. 3), as shown in FIG. 10. This is typically preferred when a tall or high aspect ratio tip is required and the risk of shearing or otherwise breaking apex of tip off probe is high (harder samples, etc). Tall tips without the flared base are more flexible and may experience undesired lateral displacement in certain applications.

Figure 11:
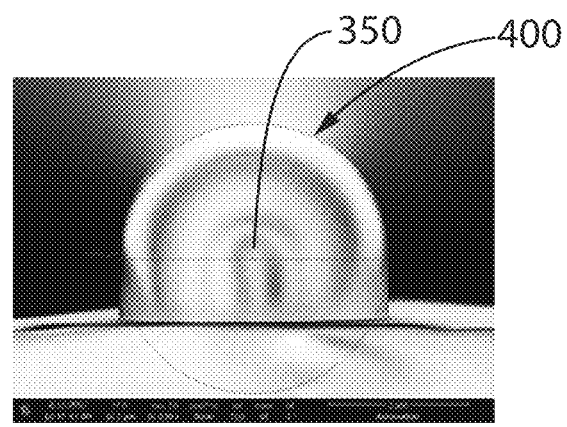
FIG. 11 is a side elevational image of a LPCVD silicon nitride deposition on a post structure such as that shown in FIG. 9.
Figure 12:
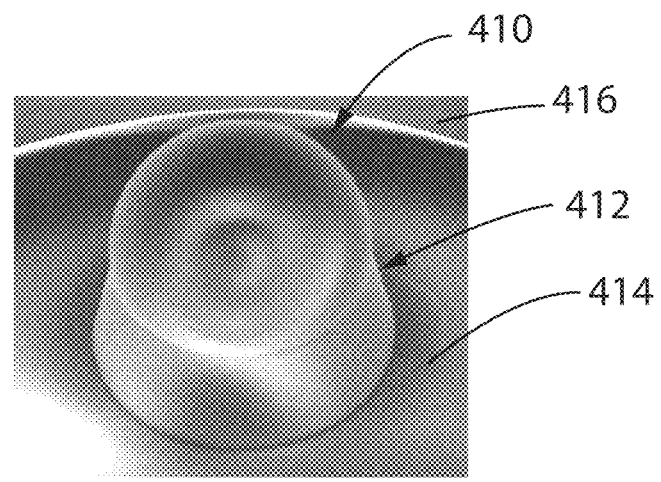
FIG. 12 is a perspective image of an LPCVD silicon nitride deposition on a post structure such as that shown in FIG. 10.

As shown in FIG. 11, an image of a hemispherical tip 400 produced on a post (350 in FIG. 9) is shown. This structure was made with a 2.90 micron LPCVD nitride deposition. In FIG. 12, an image of a tip 410 with hemispherical apex and flared base 412 (similar to funnel-shaped body 80 of schematic probe 70—FIG. 3) sitting atop a platform 414 of material conformally deposited on a silicon substrate (wafer) 416. Tip 410 is produced on a post with a flare structure using a 3.36 micron LPCVD nitride deposition. Again, for particular applications, tips with flared bases may be preferred.

Figure 13:
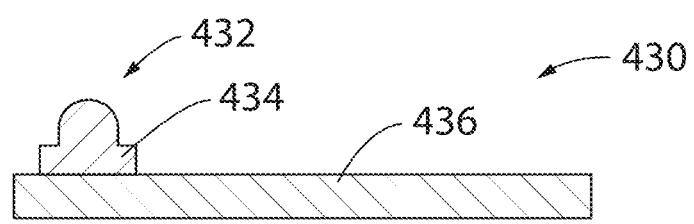
FIG. 13 is a schematic side elevational view of a probe similar to the probe of FIG. 2, but with a platform between the cantilever and low aspect ratio tip.
Figure 14:
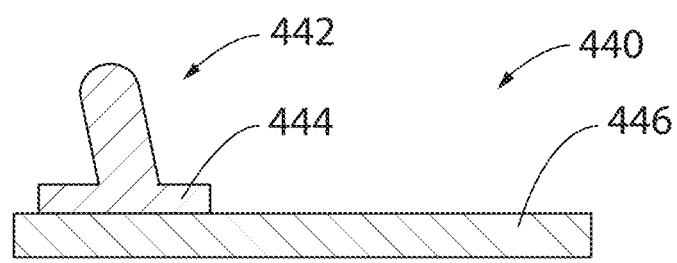
FIG. 14 is a schematic side elevational view of a probe having a high-aspect ratio tip similar to FIG. 4, but produced with a tilt to accommodate angled mounting of the probe in an AFM.
Figure 15:
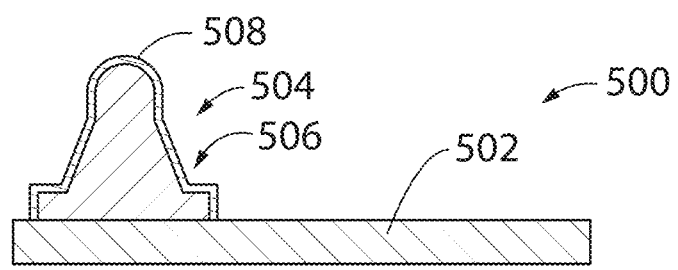
FIG. 15 is a schematic side elevational view of a probe having a functionalized tip with a flared base.

In FIG. 13, a probe 430 having a low aspect ratio tip 432, a platform 434, and cantilever 436, is shown. In this case, for particular applications, surface scanning can still be employed because the tip is more robust given its lower aspect ratio. The resolution is not nearly the same as a typical AFM, but continuous scanning can still be used to produce an AFM image. In FIG. 14, a probe 440 having a tip 442 that sits on a platform 444 (tip 442 and platform 444 deposited on a, e.g., silicon substrate that is patterned to produce cantilevers 446) is tilted at a selected angle using an appropriate masking and/or etching technique. Such a tip may be preferred when the mount for the probe assembly situates the tip at an angle relative to the surface of the sample. With the tilted tip, the engage angle between the apex of the tip and the sample can be modified so that it interacts orthogonally with the sample surface. Finally, in FIG. 15, a probe 500 is shown having a lever 502 with a tip 504 having a flared body or base 506. In this case, tip 504 is functionalized for particular applications. For example, if performing a nanoindentation experiment in a harsh environment, the tip might be at risk of being dissolved. Therefore, a coating 508 such as chrome or gold may be deposited on tip 504 to maintain the integrity of the tip. Adhesive interaction between the sample and tip may be of interest. Such coatings may enhance the user's ability to investigate this property. The coating 508 can be applied to the other tip structures and not limited to just the flared base structure.

Although the best mode contemplated by the inventors of carrying out the present invention is disclosed above, practice of the present invention is not limited thereto. It will be manifest that various additions, modifications and rearrangements of the features of the present invention may be made without deviating from the spirit and scope of the underlying inventive concept.

What is claimed is:

1. An AFM probe microfabricated by a process comprising the steps of:
    providing a substrate;
    forming an array of cylindrical posts from the substrate;
    depositing tip material on the posts so as to create a hemispherical cap on each post;
    removing the tip material around the cap to form a tip wherein the hemispherical cap has a radius greater than ¼ µm; and
    forming a cantilever for each cap, wherein the tip is a high aspect ratio tip with a height to width ratio of at least 5:1.

2. The probe of claim 1, wherein the forming step includes patterning an array of cylindrical photoresist features on the substrate, etching the substrate using the array of cylindrical photoresist features as a mask and then removing the photoresist features so as to reveal the array of posts.

3. The probe of claim 2, wherein the posts are substantially cylindrical with or without a pointed apex, and further comprising narrowing a width of the posts.

4. The probe of claim 3, wherein the narrowing step includes isotropically etching the posts or consuming the post material by oxidation and etch.

5. The probe of claim 2, wherein parameters of the substrate etch are selected so as to form the posts with a flared base.

6. The probe of claim 1, wherein the cap defines a tip of the probe, and a radius of the tip is at least ¼ micron.

7. The probe of claim 1, wherein the aspect ratio is greater than 10:1.

8. The probe of claim 1, wherein the tip material is any material that can be conformally deposited.

9. The probe of claim 8, wherein the tip material is silicon nitride.

10. The probe of claim 1, wherein the depositing step is LPCVD.

11. The probe of claim 1, wherein the substrate is a silicon wafer.

12. The probe of claim 1, wherein the cantilever is formed either from the tip material itself or from the silicon material underneath the cap.

13. The probe of claim 1, wherein the tips are tilted to accommodate mounting the probe in the surface analysis instrument.

14. The probe of claim 1, wherein the removing step includes leaving a portion of the tip material so as to form a base between the cantilevers and the caps.

* * * * *